United States Patent
Konstantatos et al.

(10) Patent No.: US 10,396,231 B2
(45) Date of Patent: Aug. 27, 2019

(54) PHOTOVOLTAIC MATERIAL AND USE OF IT IN A PHOTOVOLTAIC DEVICE

(71) Applicant: FUNDACIÓ INSTITUT DE CIÈNCIES FOTÒNIQUES, Castelldefels (Barcelona) (ES)

(72) Inventors: Gerasimos Konstantatos, Barcelona (ES); María Bernechea Navarro, Barcelona (ES); Nichole Cates Miller, Barcelona (ES)

(73) Assignee: FUNDACIÓ INSTITUT DE CIÈNCIES FOTÒNIQUES, Castelldefels (ES)

( * ) Notice: Subject to any disclaimer, the term of this patent is extended or adjusted under 35 U.S.C. 154(b) by 161 days.

(21) Appl. No.: 15/205,261

(22) Filed: Jul. 8, 2016

(65) Prior Publication Data

US 2017/0012159 A1    Jan. 12, 2017

(30) Foreign Application Priority Data

Jul. 10, 2015 (EP) .................................... 15176300

(51) Int. Cl.

| | | |
|---|---|---|
| H01L 31/032 | (2006.01) | |
| H01L 31/18 | (2006.01) | |
| H01L 31/072 | (2012.01) | |
| H01L 51/42 | (2006.01) | |
| H01L 31/0296 | (2006.01) | |
| H01L 51/00 | (2006.01) | |
| H01L 31/0256 | (2006.01) | |

(52) U.S. Cl.
CPC ........ *H01L 31/072* (2013.01); *H01L 31/0296* (2013.01); *H01L 31/032* (2013.01); *H01L 31/1864* (2013.01); *H01L 31/1868* (2013.01); *H01L 51/4233* (2013.01); *H01L 51/006* (2013.01); *H01L 51/0035* (2013.01); *H01L 51/0036* (2013.01); *H01L 51/0037* (2013.01); *H01L 51/0056* (2013.01); *H01L 51/4226* (2013.01); *H01L 2031/0344* (2013.01); *Y02E 10/549* (2013.01)

(58) Field of Classification Search
CPC ... H01L 31/032–0327; H01L 31/0392–03928; H01L 31/0749
See application file for complete search history.

(56) References Cited

U.S. PATENT DOCUMENTS

| | | | |
|---|---|---|---|
| 2011/0139233 A1* | 6/2011 | Zheng ................. | H01L 51/0036 136/256 |
| 2015/0034159 A1* | 2/2015 | Avasthi ............. | H01L 31/02167 136/261 |

FOREIGN PATENT DOCUMENTS

| | | |
|---|---|---|
| WO | 2013153024 A2 | 10/2013 |
| WO | 2013160285 A2 | 10/2013 |

OTHER PUBLICATIONS

Rodriguez, et al., "Absorber Films of Ag2S and AgBiS2 prepared by Chemical Bath Deposition." MRS Online Proceedings Library Archive 730 (2002).*

(Continued)

*Primary Examiner* — Eli S Mekhlin
*Assistant Examiner* — William E McClain
(74) *Attorney, Agent, or Firm* — Baker Hostetler

(57) ABSTRACT

The present invention relates to a photovoltaic material and a photovoltaic device comprising the photoactive material arranged between a hole transport layer and an electron acceptor layer. The present invention also relates to the use of the photovoltaic material.

13 Claims, 8 Drawing Sheets

(56) References Cited

OTHER PUBLICATIONS

Pei, et al., "High thermoelectric performance in n-type BiAgSeS due to intrinsically low thermal conductivity." Energy & Environmental Science 6.6 (2013): 1750-1755.*

Garza, et al., "AgSbSe2 and AgSb(S, Se)2 thin films for photovoltaic applications." Applied Surface Science 257.24 (2011): 10834-10838.*

Nunez, et al. "Chemical bath deposition: a promising technology to build low cost solar cells." Modern Physics Letters B 15.17n19 (2001): 605-608.*

Guin, et al. "Promising thermoelectric performance in n-type AgBiSe 2: effect of aliovalent anion doping." Journal of Materials Chemistry A 3.2 (2015): 648-655.*

Guin, et al. "Cation disorder and bond anharmonicity optimize the thermoelectric properties in kinetically stabilized rocksalt AgBiS2 nanocrystals." Chemistry of Materials 25.15 (2013): 3225-3231.*

Ip, et al. "Hybrid passivated colloidal quantum dot solids." Nature nanotechnology 7.9 (2012): 577.*

Wu, et al., Enhanced performance of hybrid solar cells based on ordered electrospun ZnO nanofibers modified with CdS on the surface, Organic Electronics, May 2012, pp. 1569-1575, vol. 13, Elsevier, The Netherlands.

Huang, et al., AgBiS2 Semiconductor-Sensitized Solar Cells, The Journal of Physical Chemistry, Aug. 2013, pp. 18308-18314, vol. 117, American Chemical Society, United States.

Liang, et al., Homogenously hexagonal prismatic AgBiS2 nanocrystals: controlled synthesis and application in quantum dot-sensitized solar cells, CrystEngComm, Jan. 2015, pp. 1902-1905, vol. 17, The Royal Society of Chemistry, United Kingdom.

Extended European Search Report from European application No. EP 15176300.0 filed Jul. 10, 2015, dated Feb. 26, 2016, 16 pp., European Patent Office, The Hague.

* cited by examiner

PHOTOVOLTAIC MATERIAL AND USE OF IT IN A PHOTOVOLTAIC DEVICE

CROSS-REFERENCE TO RELATED APPLICATIONS

This application is entitled to and claims the benefit of European Patent Application No. 15176300.0 filed on Jul. 10, 2015, the contents of which are incorporated herein by reference in its entirety.

BACKGROUND

Technical Field

The present invention relates to a photovoltaic material and a photovoltaic device comprising the photoactive material arranged between a hole transport layer and an electron acceptor layer.

The present invention also relates to the use of the photovoltaic material.

Description of Related Arts

Thin film solar cell technology has relied until now on the use of ternary and quaternary semiconductor compounds that are based on copper indium gallium sulfide/selenide or copper zinc tin sulfide/selenide that have the chalcopyrite or kesterite crystal structure as described in the article, Jackson, P., et al., "New world record efficiency for Cu(In,Ga)Se$_2$ thin-film solar cells beyond 20%." *Progress in Photovoltaics: Research and Applications*, Volume 19, Issue 7 (November 2011): pages 894-897.

A new class of solar cell devices based on colloidal nanocrystals have also been developed and demonstrated that mainly focus on binary semiconductors of PbS(Se) quantum dots (QDs) or CdSe QDs, nanorods or tetrapods. The article, Huynh, Wendy U., et al., "Hybrid Nanorod-Polymer Solar Cells." *Science* 295, 2425 (2002), describes a hybrid nanorod-polymer solar cell in which nanorods are combined with the conjugated polymer poly-3 (hexythiophene) to create charge transfer junctions with high interfacial area.

Of particular interest and promise is the case of PbS QDs that have now reached compelling power conversion efficiencies on the order of 8% in view of the advances made on increasing carrier mobility via ligand exchange strategies using bidentate molecules that crosslink the quantum dots or by using atomic ligands based on halides that also passivate the surface of the quantum dots as well as facilitate physical attachment. For example, this is described in Ip, et al., "Hybrid passivated colloidal quantum dot solids." *Nature Nanotechnology*, vol. 7 (2013): pages 577-582.

The structures employed in these materials consist of the depleted heterojunction in which a depletion region is formed between PbS QDs and a transparent electrode, typically ZnO or TiO$_2$ or other n-type semiconductors such as CdS or Bi$_2$S$_3$ nanocrystals. The resultant structure therefore forms a p-n heterojunction between the p-type QDs and the n-type phase.

A major drawback of this technology is the fact that relies on toxic elements and therefore imposes regulatory concerns about large scale deployment of this technology.

There has been increasing interest recently in the development of non-toxic materials which has led to the demonstration of a variety of nanocrystals that do not contain Pb or Cd and their employment in solar cell devices.

These materials include Cu$_2$S, CZTS, CI(G)Se, and Cu$_2$O, which share a common feature: they are p-doped semiconductors and therefore not appropriate for use as electron acceptors in polymer-nanocrystal solar cells. Recently another non-toxic material was added to the list of the promising materials for solar harnessing that consists of the binary compound of Bi$_2$S$_3$ nanocrystals. This is material that has been shown to act as an n-type semiconductor due to sulfur vacancies in the crystal structure. The high doping associated with this mechanism has thus far impeded the achievement of high performance in solar cell devices. Therefore devices using this material as the n-type electron acceptor with donor polymers have shown efficiencies on the order of 1%.

The patent application WO2013153024 describes a photovoltaic nanocomposite and solar cell device including the photovoltaic nanocomposite, where the photovoltaic nanocomposite includes a film of solution processed semiconductor materials having an n-type material selected from n-type quantum dots and n-type nanocrystals, and a p-type material selected from p-type quantum dots and p-type nanocrystals, and where the n-type material has a conduction band level at least equal, compared to vacuum level, to that of the p-type material, the p-type material has a valence band at the most equal, compared to vacuum level, to that of the n-type material. In one example the n-type nanocrystal is PbS and the p-type material Bi$_2$S$_3$.

Thus, from what is known in the art, the development of a photovoltaic material with no toxic element and a good efficiency is still of great interest.

SUMMARY OF THE INVENTION

Inventors have found that in the photovoltaic material the role of the crystal structure has been overlooked when it comes to charge separation and recombination.

Inventors have posited that a careful choice of crystal structure and position of atoms in the cationic and anionic sublattice would play a dramatic role in the performance of the photovoltaic material.

In the latter, one seeks to suppress bimolecular recombination of electrons and holes; this has been addressed in polymer solar cells by employing a bulk heterojunction using two or more materials in the composite to spatially separate electrons and holes and suppress recombination.

In the present invention, a photovoltaic material with a large static dielectric constant is described. If a material has a large dielectric constant to the extent that the Coulomb radius (the radius over which an electron and a hole would attract each other and therefore recombine) is small enough, then recombination will be suppressed due to an asymmetry in the charge distribution within the cationic sublattice, leading to domains within the crystal structure where electrons and holes remain separated and therefore do not recombine if those domains are larger than the Coulomb radius dictated by the dielectric constant of the material.

The base of the photoactive material of the present invention is a nanocrystalline ionic material with a cubic crystal structure and whose cationic sublattice consists of two alternate monovalent and trivalent cations. This results in the formation of local dipoles between the cationic and anionic sites. This structure, upon photogeneration of carriers, leads to the spatial separation of electron and holes in domains that are larger than a subunit lattice. The structure has a very large static dielectric constant in excess of 100. Therefore the Coulomb radius is smaller than the aforementioned domains and therefore bimolecular recombination of electrons and holes is suppressed. It has a bandgap in the range of 1.5 to 1.1 eV that can be controlled via the stoichiometry of the semiconductor and the nanocrystal size.

The photovoltaic material of the invention consists of the following phases: $XYS_2$ and $XYS_{2-z}V_z$ where $2>z>0$, wherein X is selected from Ag or Cu; Y is selected from Bi or Sb, and V is selected from a halogen; in the cubic lattice the cations, X and Y alternate in space and the anionic sites are occupied by sulfur atoms, or V.

The $XYS_2$ phase serves as a percolation path for electrons, whereas the $XYS_{2-z}V_z$ phase serves as a percolation path of holes.

So the photovoltaic material forms a hierarchical structure in which photons are absorbed in the two phases, the majority of those however are absorbed in the $XYS_2$ phase and dissociate into free charges due to the high dielectric constant. Then the charges are spatially separated in different nanodomains and further separated between the two phases through which they are also extracted to the selective contacts.

Therefore, an aspect of the present invention relates to a photovoltaic material comprising a cubic nanocrystalline material with the following phases: $XYS_2$ and $XYS_{2-z}V_z$ where $2>z>0$, wherein X is selected from Ag or Cu; Y is selected from Bi or Sb, and V is selected from a halogen; in the cubic lattice the cations, X and Y alternate in space and the anionic sites are occupied by sulfur atoms or V.

Another aspect of the invention is a photovoltaic device comprising:

A substrate;

the photoactive material described above arranged between:

a hole transport layer whose conduction band is lower than that of the cubic nanocrystalline material and whose valence band is lower than that of the cubic nanocrystalline material and;

an electron acceptor n-type layer whose conduction band is higher, with respect to vacuum, than that the conduction band of the cubic nanocrystalline material and whose valence band is higher than the valence band of the cubic nanocrystalline material; and metal contacts that are placed on top.

The electron acceptor acts as a selective contact for holes and prevents electron accumulation at the interface and thus recombination.

Another aspect of the invention relates to the use of the photovoltaic material in a solar cell.

DETAILED DESCRIPTION

Figure 1A:
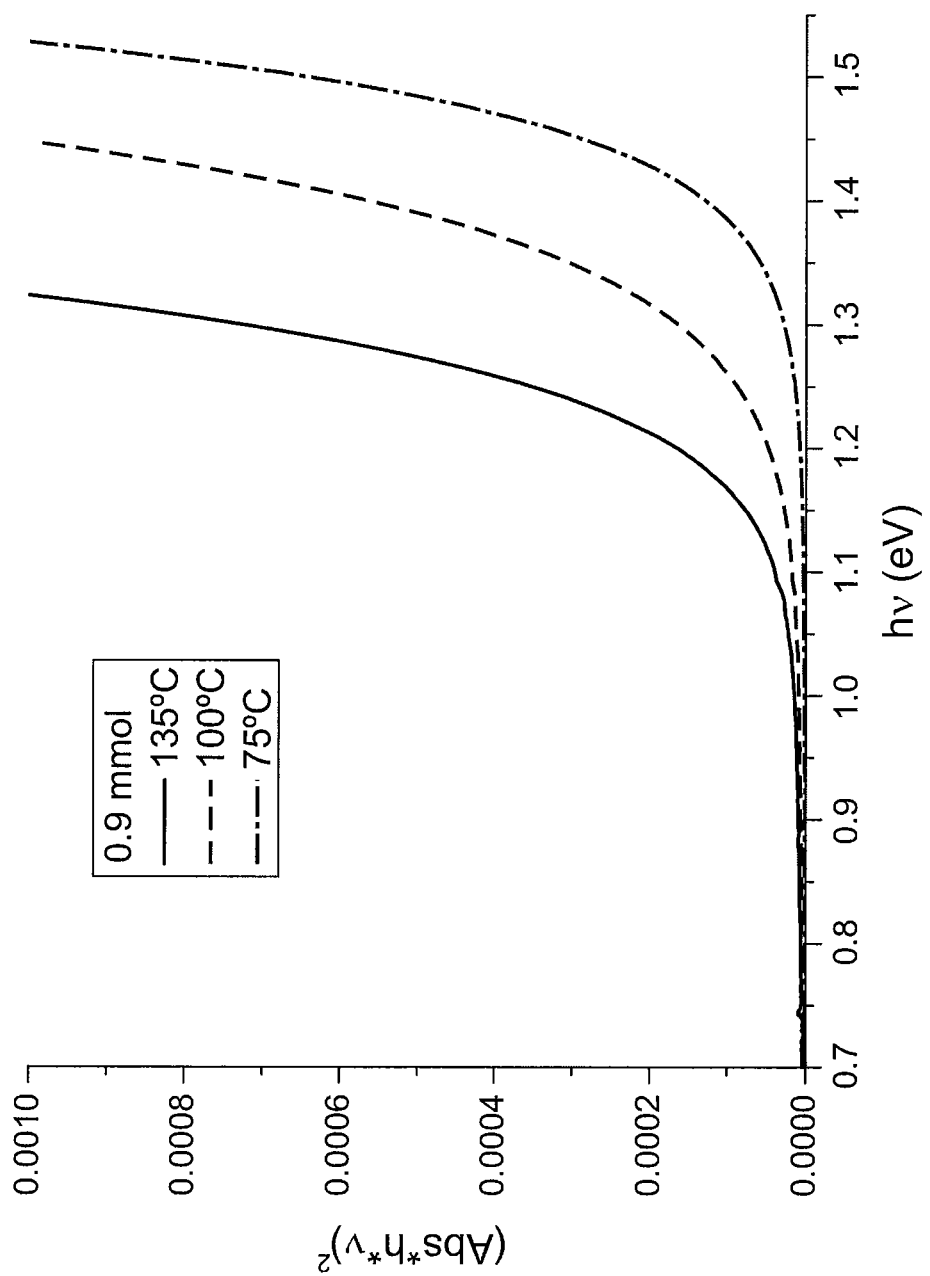
FIG. 1A shows absorbance of the nanocrystals in solution for different reaction temperatures at a given molar concentration of the cations.

As mentioned above, an aspect of the present invention relates to a photovoltaic device comprising:

A substrate;

the photoactive material described above arranged between:

a hole transport layer whose conduction band is lower than that of the cubic nanocrystalline material and whose valence band is lower than that of the cubic nanocrystalline material and;

an electron acceptor n-type layer whose conduction band is higher, with respect to vacuum, than that the conduction band of the cubic nanocrystalline material and whose valence band is higher than the valence band of the cubic nanocrystalline material; and metal contacts that are placed on top.

In a preferred embodiment the substrate is selected from: a glass or plastic substrate coated with a transparent conductive oxide. In a more preferred embodiment, the transparent conductive oxide is selected from: ITO (indium doped Tin Oxide), FTO (Fluorine doped Tin Oxide) or AZO (Aluminum doped Zinc Oxide).

In a preferred embodiment the n-type electron acceptor is selected from: ZnO, $TiO_2$, aluminum doped ZnO, or indium-doped ZnO or combinations thereof.

The hole transport layer is selected from: inorganic oxide selected from NiO, $MoO_3$, $WO_3$ or $SnO_2$ or an organic hole transport layer such as SpiroMeOTAD ($N^2,N^2,N^{2'},N^{2'},N^7$, $N^7,N^{7'},N^{7'}$-octakis(4-methoxyphenyl)-9,9'-spirobi[9H-fluorene]-2,2',7,7'-tetramine), PEDOT (Poly(3,4-ethylenedioxythiophene)) and its derivatives, PTAA (Poly[bis(4-phenyl) (2,4,6-trimethylphenyl)amine]) or other conjugated polymers like P3HT (Poly(3-hexylthiophene-2,5-diyl) or PTB7 (Poly({4,8-bis[(2-ethylhexyl)oxy]benzo[1,2-b:4,5-b'] dithiophene-2,6-diyl}{3-fluoro-2-[(2-ethylhexyl)carbonyl] thieno[3,4-b]thiophenediyl}.

In a preferred embodiment the electron acceptor has a thickness between 5 nm and 500 nm.

In a preferred embodiment the photoactive layer thickness is between 10 nm and 500 nm.

In a preferred embodiment the metal contacts are selected from: $MoO_3$, Au, Ag, Mo, Al or Mo.

To fabricate the devices, we spin-cast our nanocrystals from solution onto a ZnO layer that covers the ITO coated glass substrate. The nanocrystals then undergo a processing step in which the original oleic acid molecules are removed from the surface and are replaced with other crosslinking molecules such as ethanedithiol, benzenedithiol or alternative thiol-functionalized head groups. The ligand exchange is performed via replacement of oleic acid using halide-containing molecules such as tetra-butyl-ammonium-halide (halide=bromide, iodide, chloride). In this case cationic sites are passivated from the halide atoms forming a quaternary nanocrystal system of $AgBiS_{2-x}Y_x$ (Y=I, Br, Cl), in which charge neutrality is achieved with the inclusion of the halide atoms. Metal electrodes are then deposited on top.

Alternatively, a photovoltaic device can be made in the reverse order. In this case, the hole transport layer is deposited onto the substrate. The nanocrystals are then deposited as described above. An electron acceptor layer is then deposited and metal contacts are deposited on top.

EXAMPLES

The following examples are provided for illustrative means, and are not meant to be limiting of the present invention.

Example 1 Development of the Photovoltaic Device

Synthesis of the Nanocrystals

An example of implementing this photoactive material is via the use of colloidal chemistry for the synthesis of nanocrystals. For a typical synthesis of AgBiS$_2$ nanocrystals, 1 mmol of Bi(OAc)$_3$, 1 mmol of Ag(OAc) and 17 mmol of oleic acid (OA) were pumped overnight at 100° C. to form the bismuth and silver oleates and remove oxygen and moisture.

After this time the reaction atmosphere was switched to Ar and the temperature changed to 75° C., 100° C., 135° C.

When the mixture reached the fixed temperature 1 mmol of HMS (Hexamethyldisilathiane) dissolved in 5 ml of ODE (1-Octadecene) were quickly injected to the flask.

The nanocrystals were then isolated and purified with a solvent anti-solvent sequential process and were finally dissolved in toluene or other non-polar solvents.

The effect on the growth temperature of the reaction on the absorption spectrum is shown in FIG. 1A.

To tailor the relative stoichiometry of the cations in the nanocrystals and thereby their bandgap, the Ag precursor concentration can be adjusted accordingly.

Figure 1B:
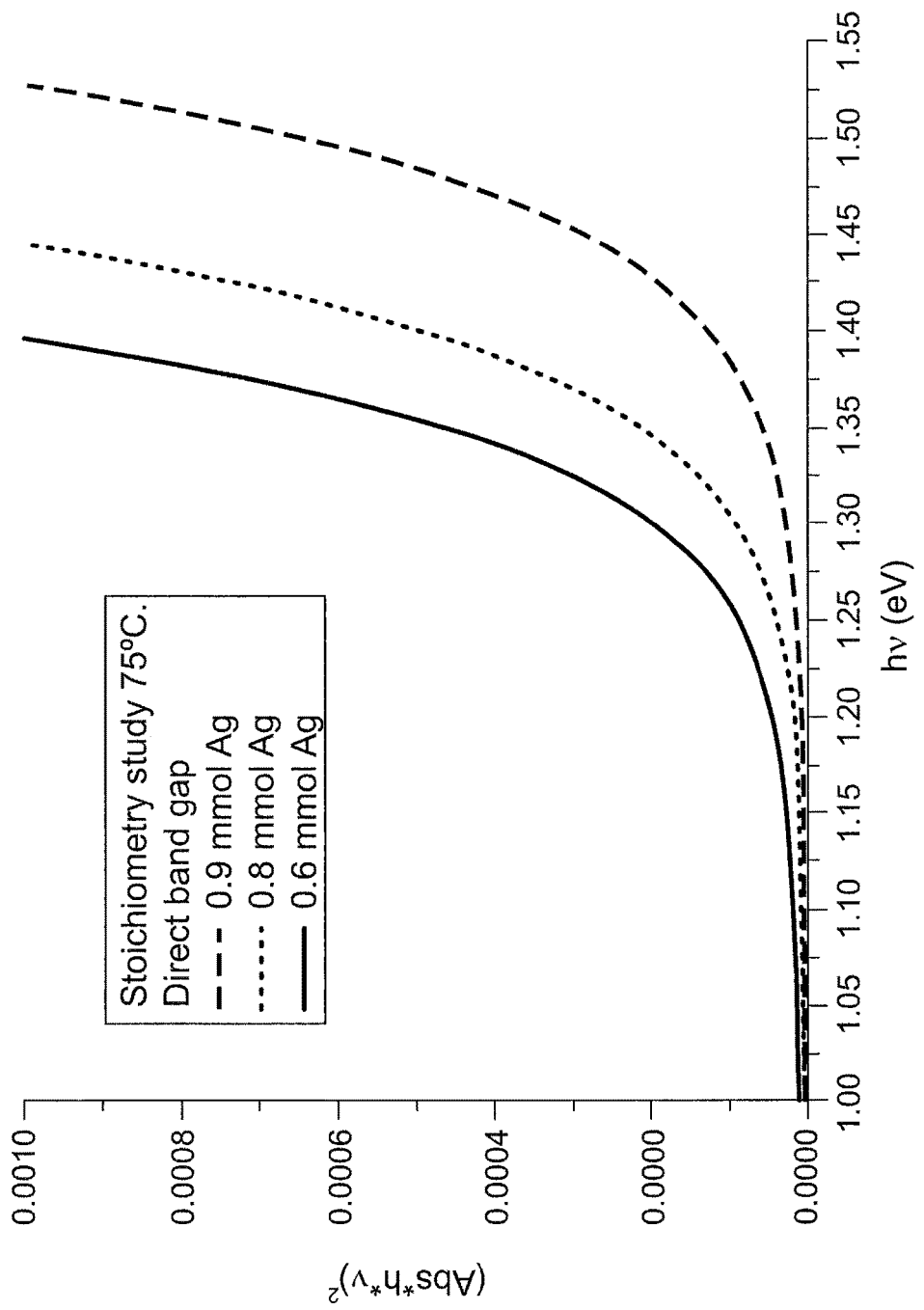
FIG. 1B shows different concentrations of the cationic precursor during synthesis for a fixed temperature of 75° C.

FIG. 1B shows the bandgap modifications of the nanocrystals using different concentration of Ag ions for a synthesis performed at 75° C.

Figure 2A:
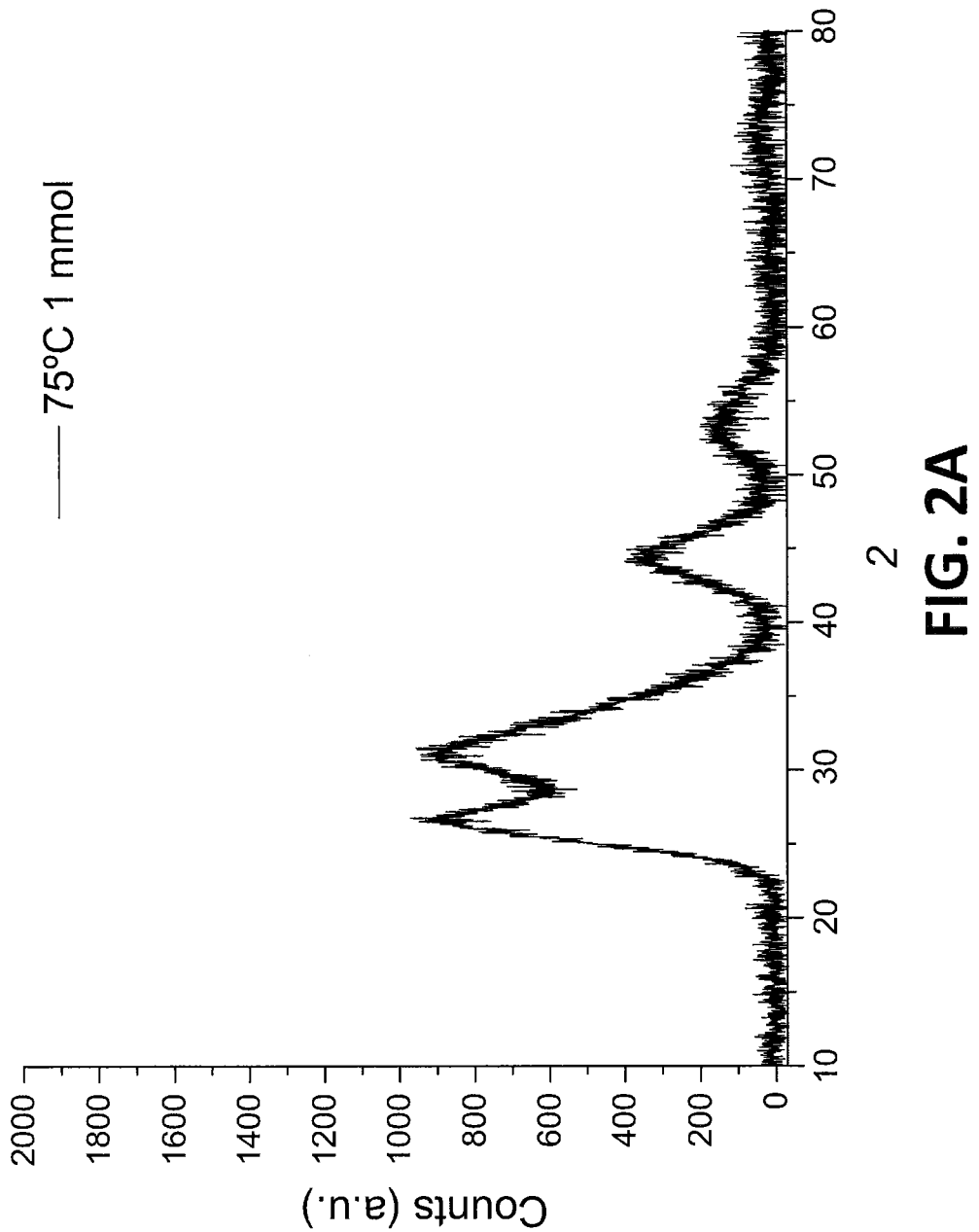
FIG. 2A shows a corresponding XRD pattern that demonstrates the cubic crystal structure of the nanocrystalline material and shows the bandgap modifications of the nanocrystals using a different concentration of Ag ions for a synthesis performed at 75° C.
Figure 2B:
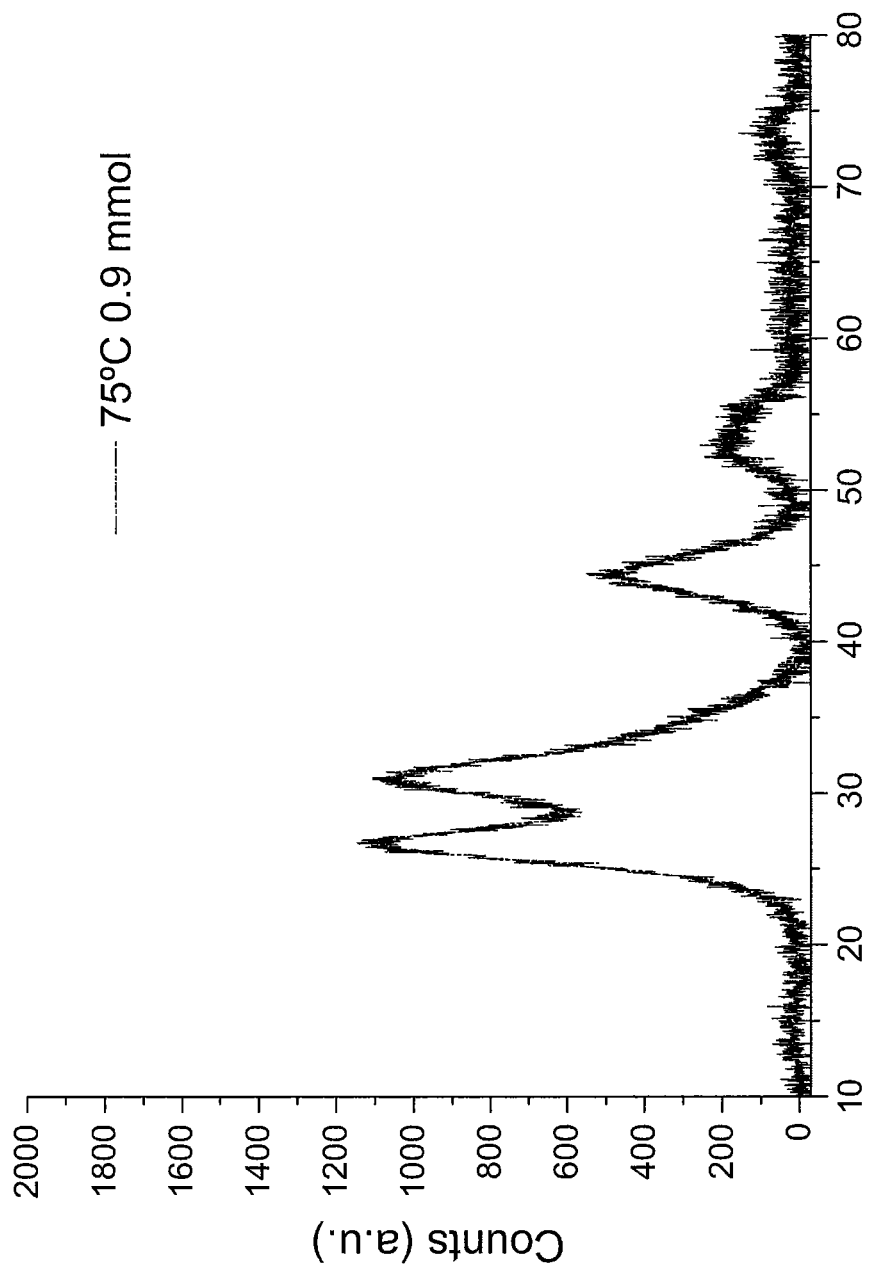
FIG. 2B shows a corresponding XRD pattern that demonstrates the cubic crystal structure of the nanocrystalline material and shows the bandgap modifications of the nanocrystals using a different concentration of Ag ions for a synthesis performed at 75° C.
Figure 2C:
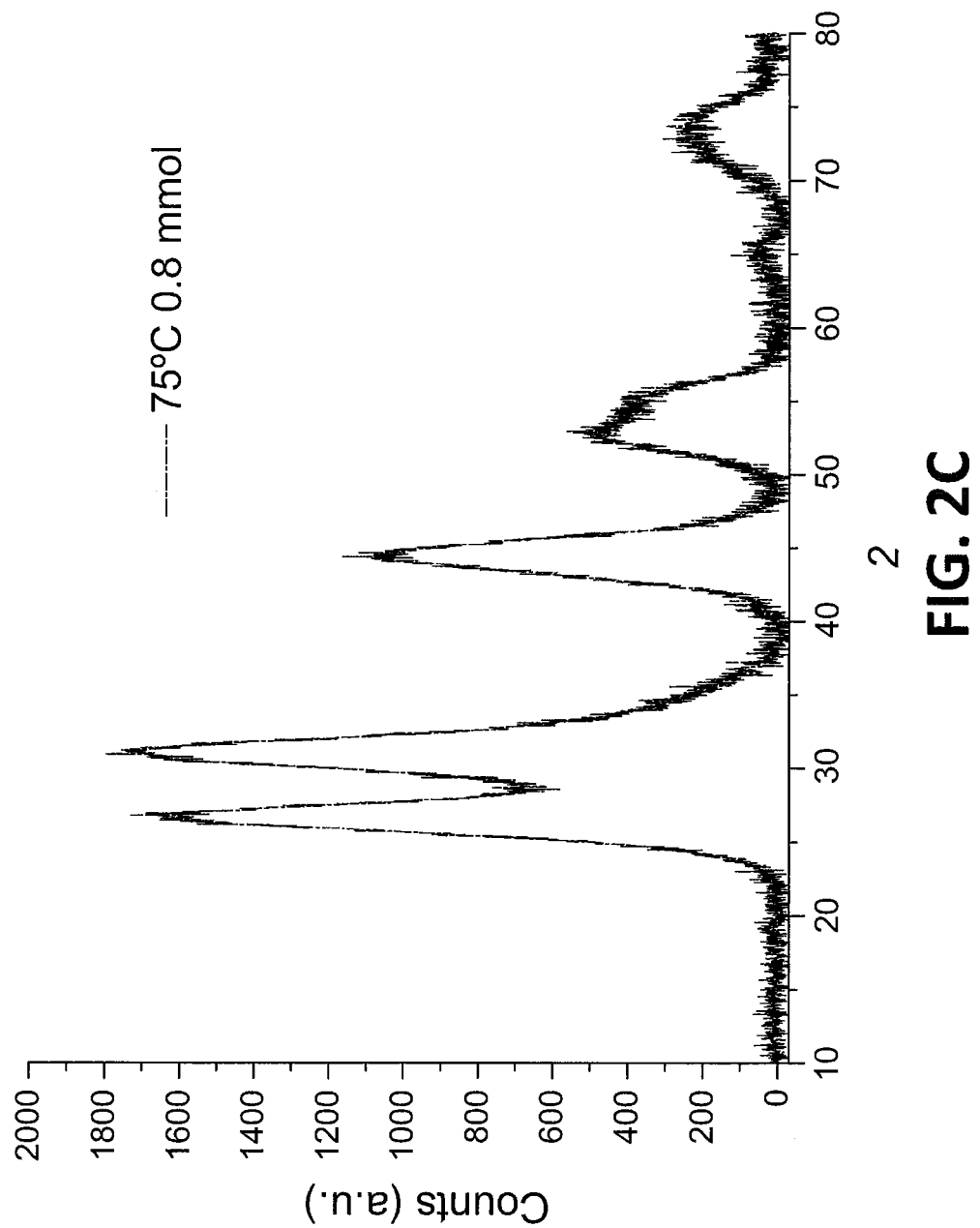
FIG. 2C shows a corresponding XRD pattern that demonstrates the cubic crystal structure of the nanocrystalline material and shows the bandgap modifications of the nanocrystals using a different concentration of Ag ions for a synthesis performed at 75° C.
Figure 2D:
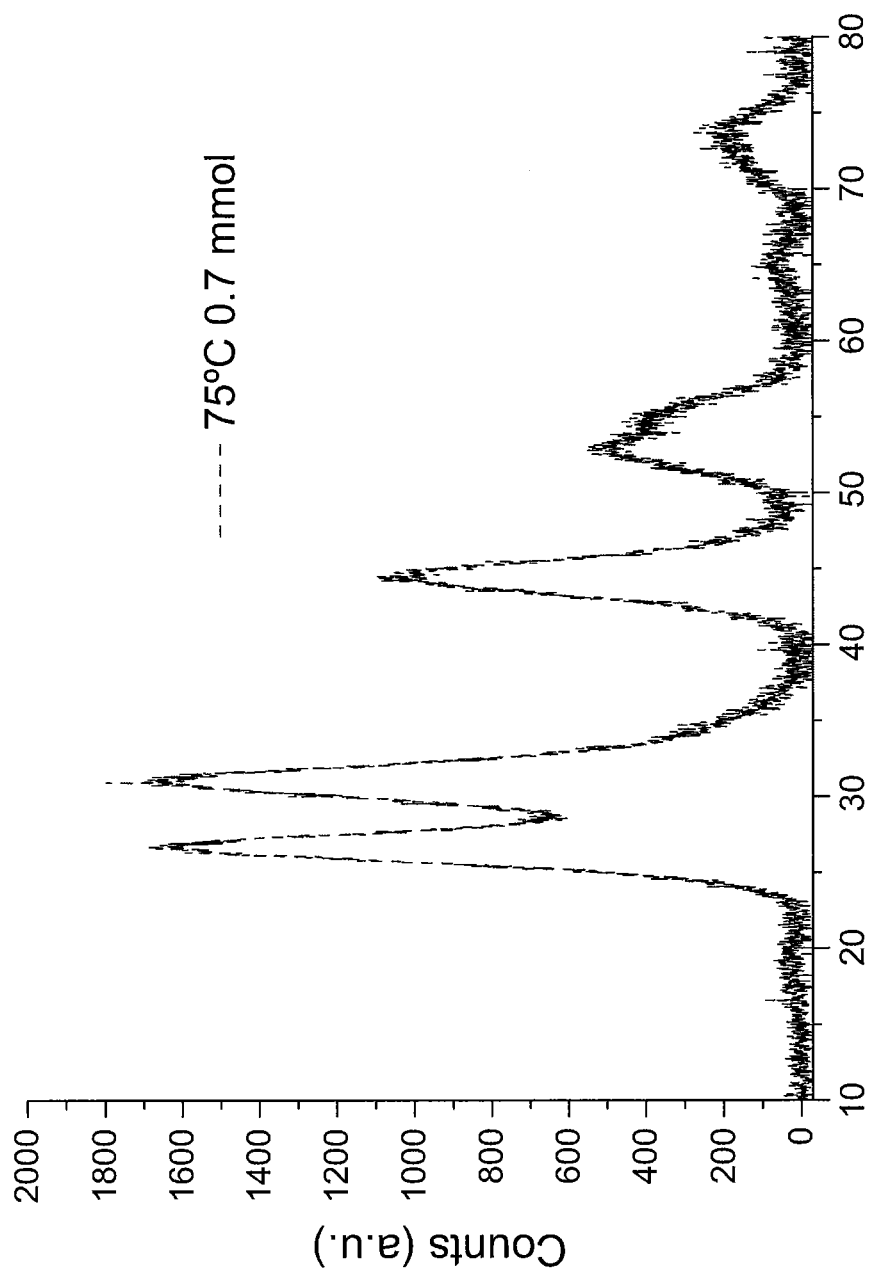
FIG. 2D shows a corresponding XRD pattern that demonstrates the cubic crystal structure of the nanocrystalline material and shows the bandgap modifications of the nanocrystals using a different concentration of Ag ions for a synthesis performed at 75° C.

FIG. 2A-2B show XRD plots for different Ag molar concentrations in the reaction for a temperature of 75° C. These plots verify the phase purity of the material and are in accordance with the cubic phase of AgBiS$_2$ semiconductors.

Fabrication of the Photovoltaic Device

ITO covered glass substrates were cleaned thoroughly by ultrasonicating in water, acetone and 2-propanol and dried using a nitrogen gun prior to device preparation.

A ZnO electron transport layer was grown using a sol-gel method. Briefly, 0.5 g of zinc acetate dihydrate was dissolved in 5 mL of methoxyethanol and 0.142 mL of ethanolamine. The solution was spin-cast onto the ITO-coated glass substrates at 3000 rpm and annealed at 200° C. for 30 minutes. This process is done twice.

Solutions of 20 g/L of AgBiS$_2$ nanocrystals in toluene were prepared by adding toluene to the original highly concentrated solution. The desired film thickness was obtained via repetition of the layer-by-layer process. One drop of nanocrystals was dispensed on top of a spinning (2000 rpm) substrate, followed by 3 drops of 1,2-ethanedithiol (EDT) 2% vol. in acetonitrile or 10 drops of tetrabutylammonium iodide (TBAI) 1 g/L in methanol. The films are rinsed with either acetonitrile or methanol and toluene after the completion of each layer.

A 5 mg/mL PTB7 solution in dichlorobenzene was prepared by stirring overnight at 50° C. A PTB7 layer was spincoated onto the AgBiS$_2$ films at 2000 rpm spin velocity for 1 minute. Metal deposition was carried out on a thermal evaporator system with a base pressure lower than $2\times10^{-6}$ mbar.

A thin layer of molybdenum oxide (3 nm, 0.1 Ås$^{-1}$) followed by Ag (150 nm, 2.5 Ås$^{-1}$) was deposited as the top electrical contact.

Figure 3:
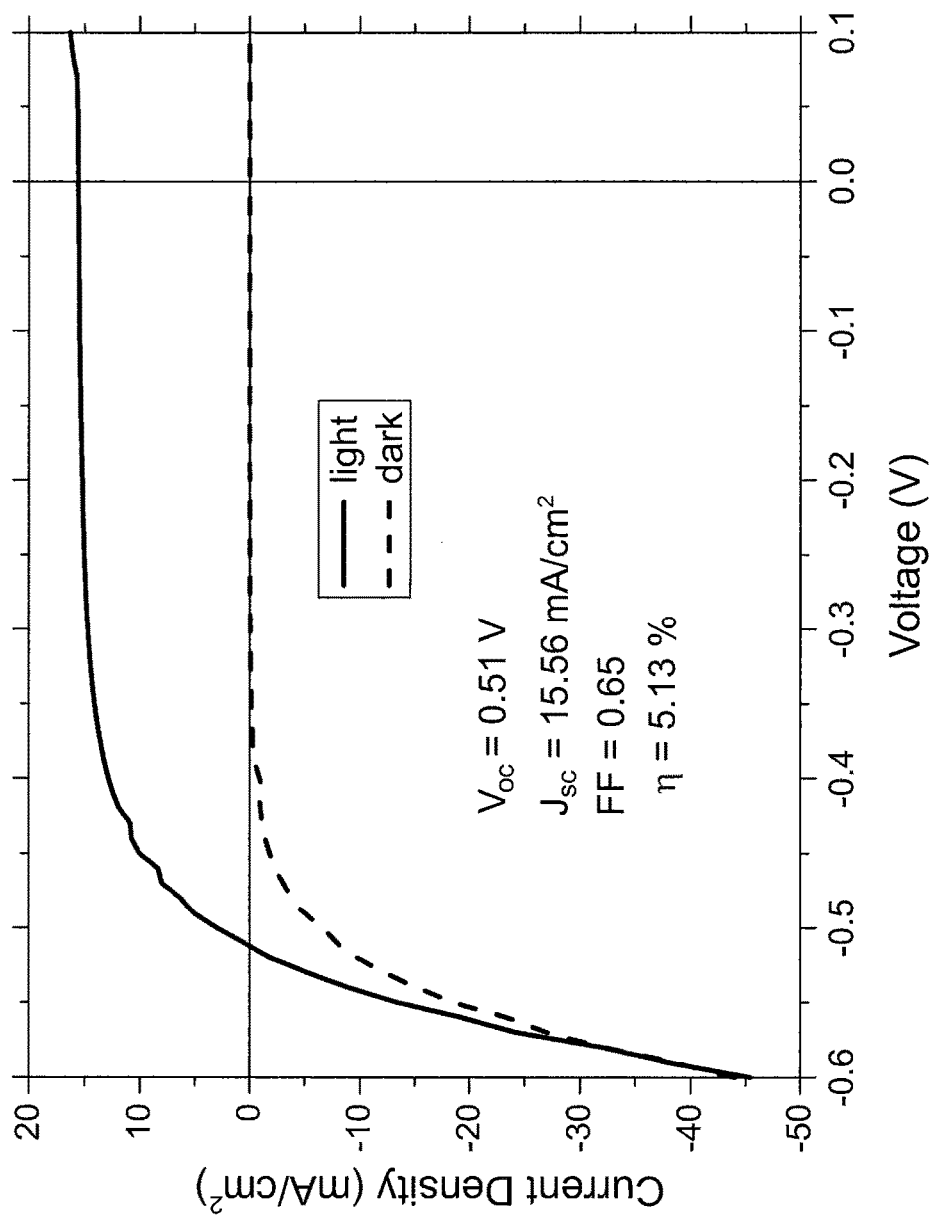
FIG. 3 demonstrates the current voltage characteristic of the reported devices under dark and solar light illumination conditions.

The devices demonstrate typically power conversion efficiencies of 5% and the current voltage characteristics are shown in FIG. 3.

Figure 4:
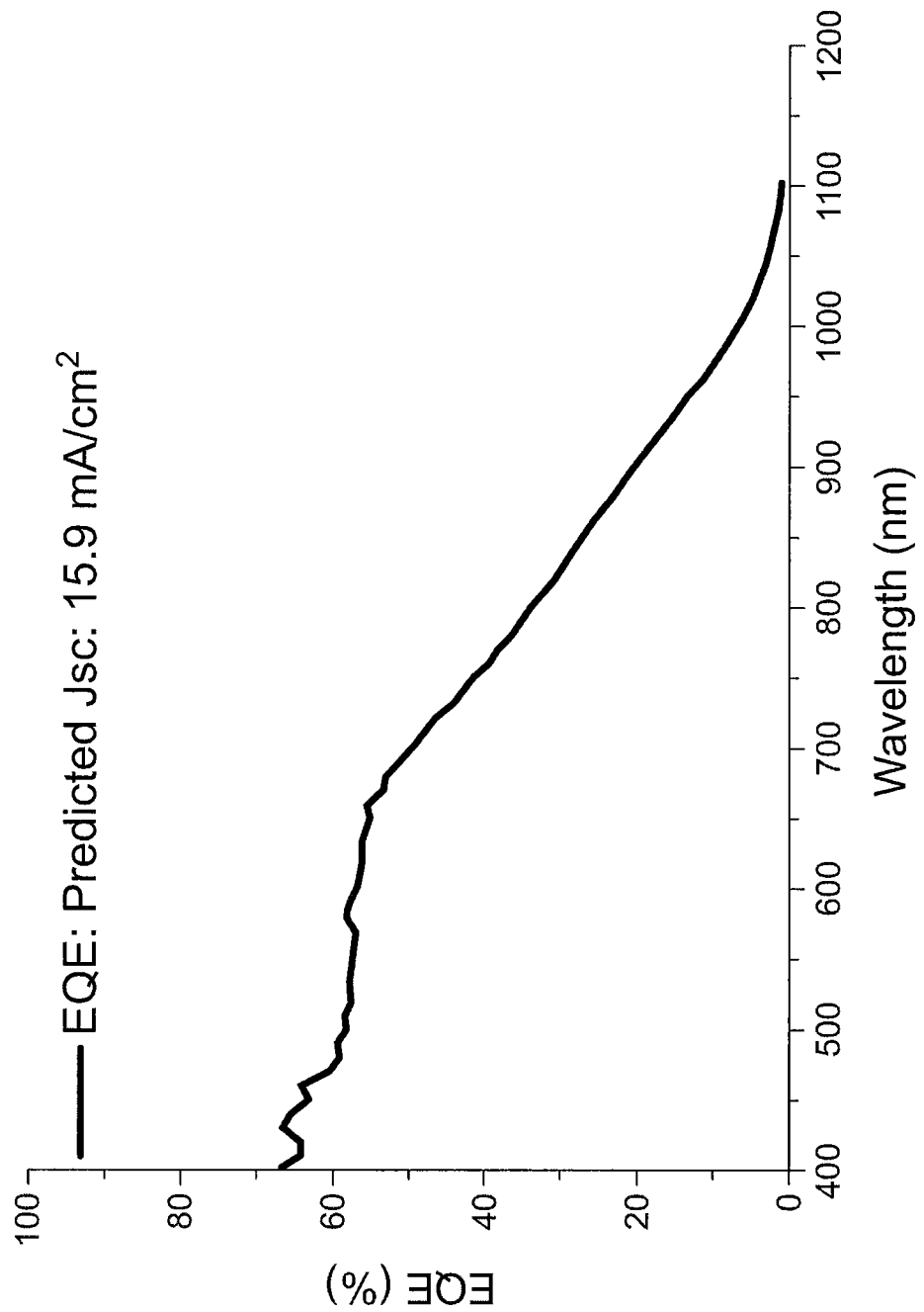
FIG. 4 illustrates the external quantum efficiency spectrum of the solar cell that follows the absorption of the $AgBiS_2$ semiconductor.

The spectral EQE shown in FIG. 4 illustrates the panchromatic solar harnessing of this device determined by the bandgap of the AgBiS$_2$ semiconductor.

What is claimed is:

1. A photovoltaic material comprising:
   a cubic nanocrystalline material with the following phases: ternary system XYS$_2$ and a quaternary system XYS$_{2-z}$V$_z$ where 2>z>0, wherein X is selected from Ag or Cu; Y is selected from Bi or Sb, and V is selected from a halogen; in the cubic lattice the cations, X and Y alternate in space and the anionic sites are occupied by sulfur atoms, or V and wherein the cationic sites are passivated from the halide atoms.

2. A photovoltaic device comprising:
   a substrate;
   a photovoltaic material comprising a cubic nanocrystalline material with the following phases: XYS$_2$ and a quaternary system XYS$_{2-z}$V$_z$ where 2>z>0, wherein X is selected from Ag or Cu; Y is selected from Bi or Sb, and V is selected from a halogen; in the cubic lattice the cations, X and Y alternate in space and the anionic sites are occupied by sulfur atoms, or V and wherein the cationic sites are passivated from the halide atoms;
   arranged between:
   a hole transport layer whose conduction band is lower than that of the cubic nanocrystalline material and whose valence band is lower than that of the cubic nanocrystalline material; and
   an electron acceptor n-type layer whose conduction band is higher, with respect to vacuum, than that the conduction band of the cubic nanocrystalline material and whose valence band is higher than the valence band of the cubic nanocrystalline material; and
   metal contacts that are placed on top.

3. The photovoltaic device of claim 2 wherein the substrate is selected from: a glass or plastic substrate coated with a transparent conductive oxide.

4. The photovoltaic device of claim 3 wherein the transparent conductive oxide is selected from: ITO (indium doped Tin Oxide), FTO (Fluorine doped Tin Oxide) or AZO (Aluminum doped Zinc Oxide).

5. The photovoltaic device of claim 2 in which the electron acceptor has a thickness from 50 nm to 500 nm.

6. The photovoltaic device of claim 2 wherein the n-type electron acceptor is selected from: ZnO, indium-doped ZnO, aluminum doped ZnO or TiO$_2$ or combinations thereof.

7. The photovoltaic device of claim 2 with a photoactive layer thickness that is from 10 nm to 500 nm.

8. The photovoltaic device of claim 2 in which the hole transport layer is selected from: an organic layer of Spiro-O-MeTAD, PTAA, PEDOT or a conjugated polymer selected from P3HT or PTB7, or an inorganic oxide selected from NiO, MoO$_3$, WO$_3$ or SnO$_2$.

9. The photovoltaic device of claim 2 wherein the metal contacts are selected from: MoO$_3$, Au, Ag, Mo, Al or Mo.

10. A solar cell comprising a photovoltaic material comprising a cubic nanocrystalline material with the following phases: $XYS_2$ and a quaternary system $XYS_{2-z}V_z$ where $2>z>0$, wherein X is selected from Ag or Cu; Y is selected from Bi or Sb, and V is selected from a halogen; in the cubic lattice the cations, X and Y alternate in space and the anionic sites are occupied by sulfur atoms, or V, and wherein the cationic sites are passivated from the halide atoms.

11. A photovoltaic material according claim 1 wherein the cubic nanocrystalline material has a bandgap in the range of 1.5 to 1.1 eV.

12. The photovoltaic device of claim 2 wherein the cubic nanocrystalline material has a bandgap in the range of 1.5 to 1.1 eV.

13. A solar cell according to claim 10 wherein the cubic nanocrystalline material has a bandgap in the range of 1.5 to 1.1 eV.

* * * * *